United States Patent [19]

Martin et al.

[11] Patent Number: 5,241,182
[45] Date of Patent: Aug. 31, 1993

[54] PRECISION ELECTROSTATIC LENS SYSTEM AND METHOD OF MANUFACTURE

[75] Inventors: Noel A. Martin, McMinnville; Robert L. Gerlach, Portland, both of Oreg.

[73] Assignee: FEI Company, Beaverton, Oreg.

[21] Appl. No.: 982,242

[22] Filed: Nov. 25, 1992

Related U.S. Application Data

[63] Continuation of Ser. No. 717,075, Jun. 18, 1991, abandoned.

[51] Int. Cl.$^5$ .............................................. H01J 3/18
[52] U.S. Cl. ........................ 250/396 R; 313/360.1; 313/361.1
[58] Field of Search ................ 250/396 R; 313/360.1, 313/361.1

[56] References Cited

U.S. PATENT DOCUMENTS

| | | |
|---|---|---|
| 2,759,117 | 8/1956 | Hasbrouck ...................... 250/396 R |
| 4,556,798 | 12/1985 | McKenna et al. .............. 250/396 R |
| 4,725,736 | 2/1988 | Crewe .............................. 250/396 R |
| 4,740,705 | 4/1988 | Crewe .............................. 250/423 F |
| 4,760,567 | 7/1988 | Crewe .............................. 369/101 |
| 4,833,362 | 5/1989 | Crewe .............................. 313/7 |

OTHER PUBLICATIONS

Van Nostrand's Encyclopedia, 5th Ed., 1976, p. 359.

Primary Examiner—Jack I. Berman
Attorney, Agent, or Firm—Dellett, Smith-Hill and Walters

[57] ABSTRACT

A precision electrostatic lens system is formed from lens electrodes having high precision inner bores by aligning said bores on a ceramic rod, inserting segmented glass spacers between adjacent electrodes, and brazing the combination together to provide a monolithic structure capable of maintaining accurate tolerances.

34 Claims, 2 Drawing Sheets

PRECISION ELECTROSTATIC LENS SYSTEM AND METHOD OF MANUFACTURE

This is a continuation of application Ser. No. 07/717,075 filed Jun. 18, 1991.

BACKGROUND OF THE INVENTION

The present invention relates to electrostatic lens systems and particularly to a system for accurately focusing a charged particle beam to a very small spot.

Apparatus for generating charged particle microbeams for use in laboratory instruments such as scanning electron microscopes and the like require highly accurate beam focusing. The electrostatic focusing lens system employed should be of high precision, exhibiting a high degree of concentricity and circularity, to generate a beam that can be concentrated to a very small spot on a target or specimen.

The lens electrodes in such a focusing lens system need to be provided with precisely aligned apertures through which the charged particle beam passes, while the electrodes must also be spaced at precise distances in parallel relation to one another. Stacked ceramic cylinders have been employed for spacing and supporting focusing electrodes, wherein the cylinders provide an outer reference. An accurately manufactured cylinder peripherally supports an electrode or electrodes therewithin such that the electrodes are then centered. However, not only must the ceramic cylinders be machined to high tolerances, but also the lens electrodes must have accurately machined circumferential surfaces where they are received by the cylinders. Since the tolerances at the interfaces are added together, it can be very difficult to hold accurate concentricity and parallelism.

More commonly, a glassed structure is employed wherein focusing electrodes are supported on metal wires that extend inwardly from glass members. This method may employ an aluminum centering rod or a mandrel that is later removed chemically after the glassed supporting structure has been formed. However, focusing columns manufactured in this way tend to vibrate and in particular resonate at certain frequencies. The result is undesired beam vibration. Furthermore, these structures are difficult to manufacture since considerable manufacturing skill is required.

SUMMARY OF THE INVENTION

According to the present invention, a precision electrostatic lens structure is manufactured by forming plural metal electrodes with side surfaces adapted for parallel juxtaposition and having accurate bores extending centrally therethrough in a direction substantially perpendicular to the side surfaces. A ceramic aligning rod is positioned through the bores of adjacent electrodes where the rod is closely received by the bores for precisely aligning the electrode bores. Dielectric spacer members of accurately predetermined thickness are inserted between adjacent electrodes and a brazing material is inserted at the interfaces between the adjacent electrodes and the spacer members. The electrodes with spacer members therebetween are then urged together at an elevated temperature for a predetermined time period for accomplishing brazing between the adjacent electrodes and the spacer members. The aligning rod is removed from the resulting monolithic focusing structure which is then capable of accurately maintaining the desired configuration.

In accordance with the preferred form of the present invention, the spacer members are segmented and the segments are spaced from one another around the axis of aligned bores to minimize differential expansion and contraction between the electrode surfaces and spacer members during the heating step or during gun usage. Improved access to the electrodes is enabled in a compact structure. The assembly produced is characterized by enhanced concentricity and parallelism between elements on the order of about ten microns.

It is accordingly an object of the present invention to provide an improved precision electrostatic lens structure capable of accurately concentrating charged particle beams.

It is another object of the present invention to provide an improved precision electrostatic lens structure which is capable of maintaining dimensional accuracy.

It is another object of the present invention to provide an improved precision electrostatic lens structure exhibiting very high precision concentricity, circularity and electrode parallelism.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DRAWINGS

FIG. 1 is a longitudinal cross-section of a charged particle gun structure incorporating a precision electrostatic lens system according to the present invention, FIG. 2 is a longitudinal cross-section illustrating a step in the manufacture of the FIG. 1 lens system, FIG. 3 is a transverse cross-section taken at 3—3 in FIG. 1, and FIG. 4 is a transverse cross-section taken at 4—4 in FIG. 1.

DETAILED DESCRIPTION

Figure 1:
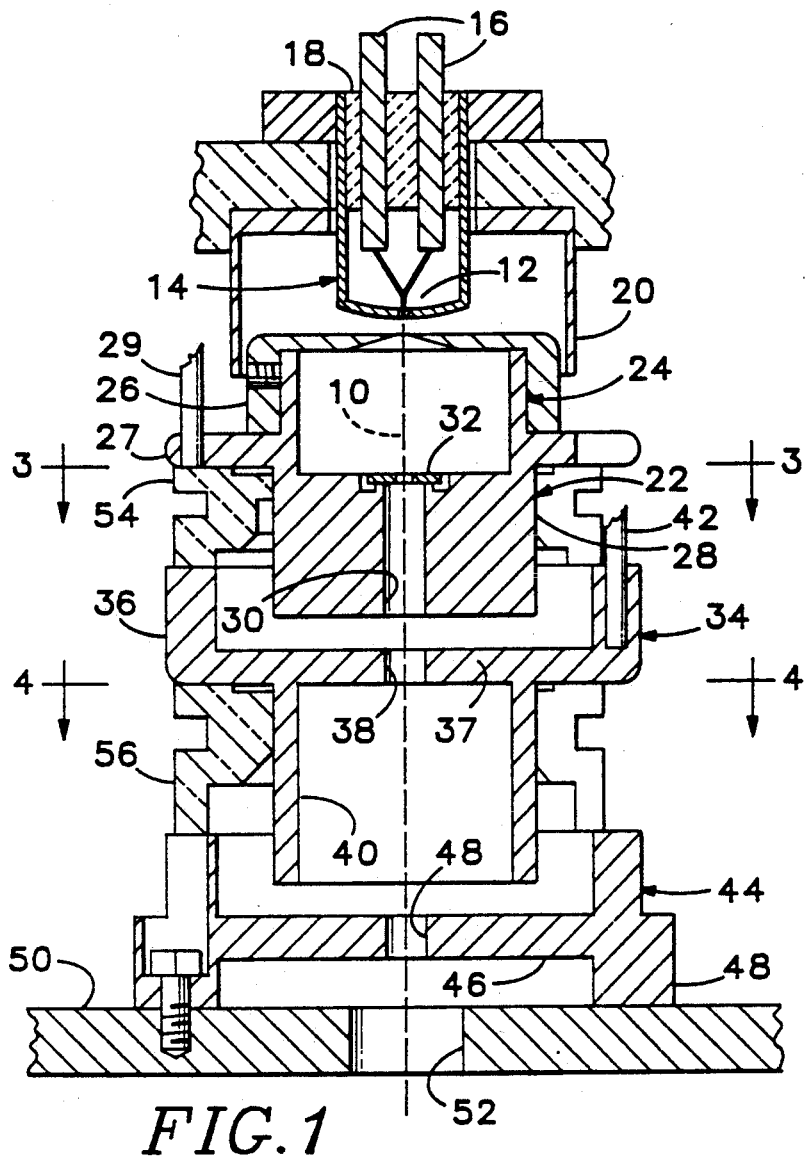

Referring to FIG. 1 illustrating a charged particle gun structure, the interrelationship of the elements will be discussed with respect to electron emission although it will be realized the same focusing system can be employed with appropriate changes in potential for similarly controlling an ion beam. In the present example electron beam 10 is derived from Schottky emission source 12, the tapered point of which extends through a small aperture in the lower or forward end of the suppresser electrode 14. The Schottky emitter is supported from conducting rods 16 extending through ceramic member 18 as received within the upper cylindrical part of the suppresser electrode. Shield 20, maintained at the potential of the suppresser electrode by means not shown, extends downwardly in surrounding relation to the suppresser electrode and emitter, as well as the upper portion of the lens structure.

The lens structure comprises an extractor electrode 22 having an upper cylindrical part 24 covered at its upper extremity by extractor cap 26 except for a small (e.g. 15 mil) central aperture in the cap aligned with a similar sized aperture in suppresser electrode 14 and through which electron beam 10 passes. The central aperture in cap 26 is located in a thin section of the cap surface with the underside of the cap tapered away from this aperture. Lower cylindrical portion 28 of extractor electrode 22 is substantially solid except for central bore 30 suitably having a diameter of 120 mils. A beam defining piece 32 is positioned within a recess at the upper end of bore 30 being provided with a small beam defining central aperture on the order of 2 mils in diameter.

The electrode 22 includes upwardly open cylindrical section 24 with a relatively large inside diameter, and the lower, larger outside diameter cylindrical section 28 is provided with precision inner bore 30 intended to be substantially coaxial with the path of electron beam 10. A radial flange 27 extends outwardly from the lower part of electrode section 24 for mounting and electrical connection purposes, receiving a post or lead 29 suitably connected to an appropriate voltage source.

The electrostatic lens system further comprises a second or focusing electrode 34 spaced precisely below extractor electrode 22. Upper cylindrical section 36 of electrode 34 is substantially greater in inside diameter than the exterior diameter of electrode section 28 thereabove and is disposed in surrounding or overlapping relation with respect to approximately the lower one-third of electrode section 28. The lower wall 37 of electrode section 36 is provided with a central bore 38 precisely aligned with bore 30, i.e., coaxial with the path of electron beam 10, and suitably of the same diameter, e.g. 120 mils. A lower cylindrical skirt portion 40 of electrode 34 extends downwardly from lower wall 37, the inside diameter of the skirt portion being substantially larger than that of bore 38 while its outside diameter is suitably less than that of electrode section 36. The inside cylindrical cavity of skirt portion 40 is precisely coaxially aligned with the path of electron beam 10 and bore 38. Electrical post or lead 42 connects electrode 34 to a suitable operating voltage.

The third or lower cylindrical electrode of the electrostatic lens comprises a precisely positioned anode or ground electrode 44 having an upper inside diameter greater than the exterior diameter of the aforementioned skirt 40, and including a central transverse wall 46 located below skirt 40, the wall 46 having surfaces parallel with juxtaposed surfaces of the other electrodes and provided with a precisely located center bore 48 in coaxial alignment with the aforementioned bores 30 and 38 as well as with the path of electron beam 10. The diameter of bore 48 is suitably the same as that of bores 30 and 38, e.g. 120 mils in the case of a specific embodiment. The upper open portion of electrode 44 overlaps approximately the lower quarter of skirt 40. Electrode 44 further includes a lower cylindrical flange 48 which raises wall 46 above the surface of support plate 50 separating the electron gun from a chamber therebelow suitably housing deflection apparatus and lens means (not shown) for a scanning electron microscope or the like. An aperture 52 in plate 40 passes electron beam 10.

The exterior diameters of electrode 44, electrode section 36, and flange 27 are at least approximately the same, and the differences between inside and outside diameters of electrode 44 and electrode section 36 are approximately the same so as to engage dielectric spacer elements 54 and 56 disposed respectively between flange 27 and electrode section 36 and between electrode section 36 and electrode 44. Source 12 is precisely aligned with respect to the centerline of bores 30, 38 and 48 with a movable centering means (not shown) ultimately supported from plate 50.

In a specific example, the following voltages were applied to the various electrodes:

| Emmiter 12 | −25 KV |
|---|---|
| Suppresser 14 | −25.5 KV |
| Extractor 24 | −20 KV |
| Focus 34 | −24.3 KV |
| Anode 44 | 0 |

The focusing properties of this general type of lensing system are as described in U.S. Pat. No. 4,629,898 to Orloff and Swanson.

According to the process of the present invention, the above-described electrodes and spacer elements are brazed together in a precision manner to provide a monolithic structure wherein close tolerances are held for accurately focusing an electron beam or other charged particle beam. The materials selected are suitable for comparatively high temperature brazing and are chosen not to outgas at the extremely low pressures encountered during normal operation of the FIG. 1 apparatus.

A high degree of parallelism is desired between the various juxtaposed electrode surfaces as well as between the electrodes and the insulating spacers 54 and 56 disposed therebetween. A refractory material for the insulating spacers 54, 56 may be employed, with alumina or a similar ceramic being suitable examples. However, a machinable glass of the type manufactured under the name Macor by Corning Glass Company is preferred because of its electrical breakdown avoidance properties and because its machinability facilitates the preparation of spacers 54, 56 having exactly parallel side faces spaced apart by a predetermined thickness such that the electrodes spaced therewith can be maintained in precise parallelism and at exact positions. A high temperature compatible conductive material for the electrodes, substantially matching the thermal expansion coefficient of the spacers, is employed and in a specific embodiment comprised a titanium alloy composed of approximately 90% titanium, 6% aluminum and 4% vanadium.

Figure 2:
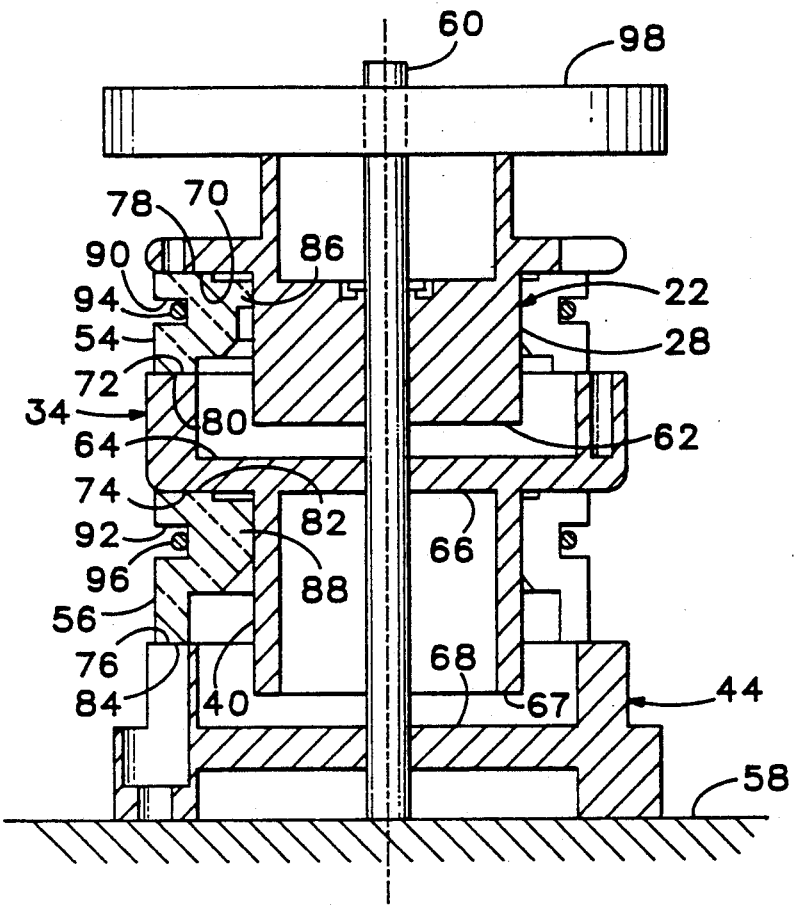

FIG. 2 illustrates the process of assembling the electrode and spacer elements together for brazing. The components are suitably assembled for positioning on an oven platform 58. A refractory rod 60 is inserted through the central bores in electrodes 22, 34 and 44 for precisely aligning the same, the juxtaposed electrode surfaces 62, 64, 66, 67 and 68 being perpendicular to the aforesaid bores. The rod 60 is closely received in the bores for rendering the same nearly perfectly coaxial, and may also extend into a mating hole in platform 58 to insure perpendicularity. Rod 60 is suitably a ceramic material and in a preferred embodiment was formed of alumina, a material that does not adhere to the titanium electrodes. Assuming the diameter of each bore is 0.1202+0.0002−0 inches, the outside diameter of the rod should be 0.1200+0−0.0002 inches, with the spacing between the rod and the apertures it centers desirably being about 2/10 of a thousandth of an inch. In this example, the central bores in each of the electrodes 22, 34 and 44 are of the same diameter, but bore diameters of progressively changing sizes can be accommodated with a stepped refractory rod, i.e., assuming the bores proceed in order of ascending or descending diameter.

Opposing juxtaposed surfaces 62, 64, 66, 67 and 68 of the electrodes are machined to be precisely parallel with each other as well as with juxtaposed surfaces 70, 72, 74 and 76 where the latter meet parallel faces or pads 78, 80, 82 and 84 of the spacer elements 54, 56. The spacers are also machined to a high tolerance in terms of thickness and parallelism, and therefore the parallelism of electrode surfaces 62, 64, 66, 67 and 68 is assured.

Figure 3:
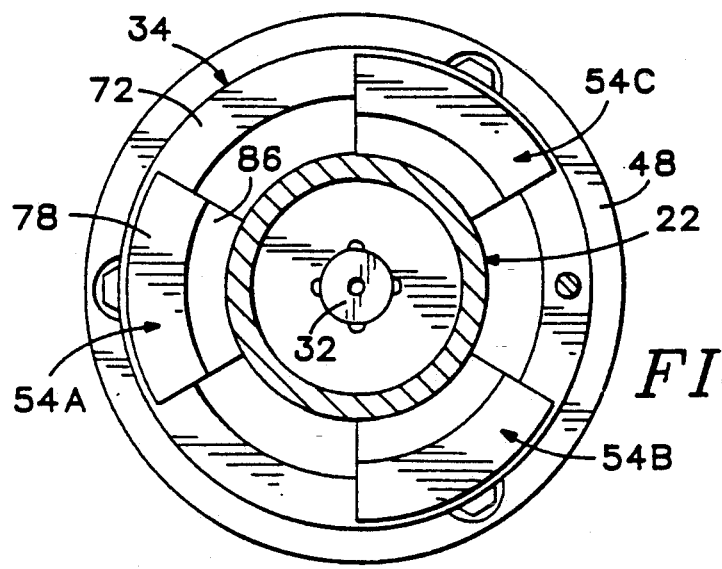
Figure 4:
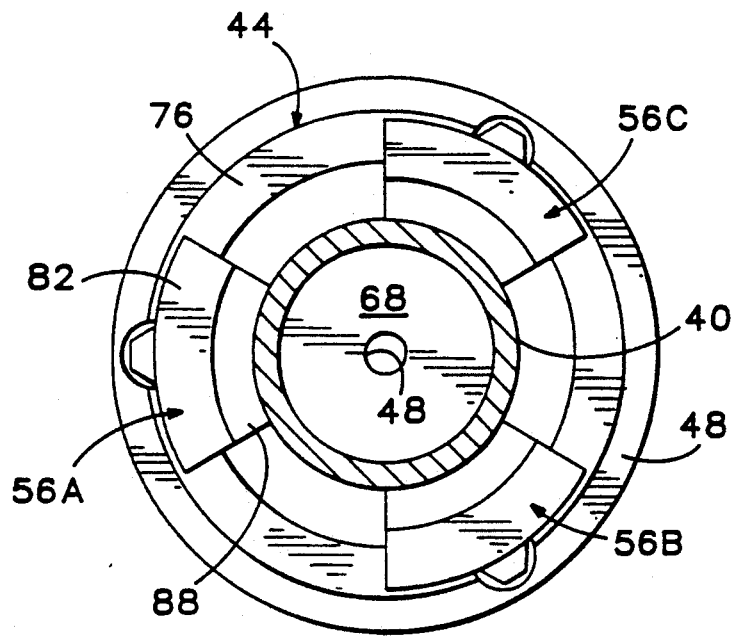

In accordance with the preferred embodiment, the spacers 54, 56 inserted between adjacent electrodes are segmented and preferably separated as illustrated in the cross sections of FIGS. 3 and 4. Thus, spacer 54 includes three sections 54A, 54B and 54C, comprising 60-degree segments or portions of a circular configuration disposed at 120-degree intervals about the axis of the electrode bores and rod 60, and having 60-degree spacing therebetween. In manufacture, the spacers 54, 56 are formed as completely solid figures of revolution and are severed into the segments as shown, wherein, for purposes of the present discussion, a segment is defined as a solid having a transverse cross section (perpendicular to the beam) of a truncated sector of a circle. This segmentation reduces the possibility of cracking after the subsequent brazing step because of the thus limited differential expansion or contraction between the ceramic and metal elements. The segmentation further provides better access to the electrodes, e.g. for connecting the same, and provides a smaller and more compact structure. The segments can have other cross sectional shapes if desired.

It will be noted that the parallel pads 78, 80, 82 and 84 on insulating spacers 54, 56 providing spacer faces which meet the electrodes are limited in radial extent so as to abut electrode surfaces 70, 72, 74 and 76 proximate the outer periphery of the electrodes and are relieved away from the electrodes except for inner circular pads 86 and 88 which abut the outer periphery of elongated electrode sections 28 and 40. Moreover, the spacers 54, 56 are provided with circumferential grooves at 90 and 92, whereby additionally to provide a more lengthy surface path between adjacent electrodes to help prevent high voltage breakdown during operation.

The insulating spacer segments, suitably having brazing material applied thereto, are slideably inserted between adjacent electrodes, along the parallel surfaces of the electrodes they separate, until the pads 86, 88 respectively abut elongated cylindrical section 28 of electrode 22 and skirt 40 of electrode 34. The insulating spacer segments are then drawn toward the electrodes by means of tensioning wires 94 and 96 threaded around grooves 90 and 92 respectively in the various spacer segments and drawn tight.

Brazing material applied between the electrodes and spacer elements, i.e., at the interfaces defined at 70, 78; 72, 80; 74, 82; and 76, 84, respectively, suitably comprises CuSil A.B.A. (active braze alloy) manufactured by GTE Products Corp. of Belmont, Calif. This material is provided in paste form for application. The brazing is desirably a one-step process avoiding metalizing of the glass or ceramic parts. Other brazing materials such as foils or wires or other preparations can alternatively be utilized.

After insertion of rod 60 and the segmented spacer elements 54, 56, with the spacer elements drawn toward the electrodes with wires 94, 96, the assembly with the brazing material applied is located in a vacuum oven and a weight 98, having a central aperture for passing rod 60, is placed on top of electrode 22. The weight 98, which is suitably a one pound molybdenum slug, insures the stack of elements is compressed vertically during the braze whereby the elements settle to a flat or parallel condition. The combination is raised in temperature to approximately 810° C. over a six-hour period, gradually increasing the temperature over approximately 2.75 hours, holding the temperature at 810° C. for one-half hour, and gradually reducing the temperature during a following period of 2.75 hours. The slow cycling up and down in temperature avoids introducing too much thermal stress along the brazed surfaces. After cooling, the weight 98 and rod 60 are removed, with the resulting structure, taken from the oven, comprising a monolithic electrode column characterized by very close tolerances and capable of maintaining those tolerances for an extended time under adverse conditions. It has been found that the resulting assembly is characterized by enhanced concentricity and parallelism on the order of about 10 microns. For use in an electron gun or the like, beam defining piece 32, not present during previous assembly and brazing, is received within an accurately countersunk hole in electrode 22. The gun may be subsequently baked for an extended period for outgassing in a conventional manner at approximately 180° C.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method of forming a precision electrostatic lens structure capable of accurately focusing a charged particle beam, said method comprising the steps of:

forming plural metal electrodes with side surfaces adapted for juxtaposition with one another, said electrodes being laterally movable relative to one another for therethrough, positioning an aligning rod through said bores in a pair of adjacent electrodes so as to be closley received by said bores for aligning the same, inserting a dielectric spacer member of predetermined thickness between said pair of adjacent electrodes, inserting brazing material at interfaces between said adjacent electrodes and said spacer member, urging said adjacent electrodes and said spacer member together and raising the combination of said adjacent electrode, said spacer member and said brazing material as thus urged together to an elevated temperature for a predetermined period of time to secure said adjacent electrodes to said spacer member by brazing, lowering said temperature and physically removing said aligning rod from said bores which closely received the same.

2. The method according to claim 1 wherein said spacer member is segmented such that segments thereof are separately insertable.

3. The method according to claim 2 wherein the segments of said spacer member are inserted in circumferentially spaced relation to one another.

4. The method according to claim 2 including urging said segments radially inwardly relative to the axis of said bores prior to raising the combination to said elevated temperature.

5. The method according to claim 4 wherein the electrodes of said adjacent pair are provided with axial portions against which said dielectric spacer members are inwardly urged prior to brazing.

6. The method according to claim 1 wherein the materials for said electrodes and said spacer member are selected to have substantially similar thermal coefficients of expansion.

7. The method according to claim 6 wherein said electrodes are formed of a titanium alloy and said spacer member is formed of a material selected from the group consisting of alumina and machinable glass.

8. The method according to claim 1 wherein said adjacent electrodes with said spacer member therebetween are urged together in a stack by weighting said stack.

9. The method according to claim 1 wherein the combination is raised to an elevated temperature in a vacuum oven.

10. A method of forming a precision electrostatic lens structure capable of accurately focusing a charged particle beam, said method comprising the steps of:
   forming plurality metal electrodes with side surfaces adapted for accurate juxtaposition with respect to one another,
   providing said electrodes with high precision central bores in a direction substantially orthogonal to said side surfaces,
   positioning a precision aligning rod through said bores in said electrodes so as to be closely received by said bores for aligning the same while said juxtaposed side surfaces are parallel to one another perpendicular to said rod,
   inserting a dielectric spacer member between adjacent electrodes, said spacer member having a predetermined thickness and having parallel opposite surfaces for location in facing relation to juxtaposed side surfaces of adjacent electrodes to define interfaces therewith,
   inserting brazing material at said interfaces between said adjacent electrodes and said spacer member,
   urging said adjacent electrodes and said spacer member together in close contact with said brazing material,
   raising the combination of said electrodes, said spacer member and said brazing material, while said combination is urged together, to an elevated temperature for a predetermined period of time to secure adjacent electrodes to said spacer member by brazing,
   lowering said temperature and removing said aligning rod from said bores which closely received the same.

11. The method according to claim 10 wherein said adjacent electrodes and said spacer member therebetween are urged together in a stack by weighting said stack.

12. The method according to claim 10 including inserting at least one additional dielectric spacer member between said adjacent electrodes, including placing said additional spacer member at a different and spaced position about the axis of said bores from the first mentioned spacer member, and providing brazing material between said additional spacer member and said adjacent electrodes prior to raising the combination to said elevated temperature.

13. The method according to claim 12 wherein said dielectric spacer members are urged radially inwardly prior to raising the combination to said elevated temperature.

14. The method according to claim 13 wherein an electrode of said pair of adjacent electrodes is provided with an axial portion against which said dielectric spacer members are radially urged prior to brazing.

15. The method according to claim 13 wherein said dielectric spacer members are urged inwardly with a taut wire located in circumferential grooves in said spacer members.

16. The method according to claim 10 wherein said electrodes are formed of titanium alloy and said dielectric spacer members are formed of material selected from the group consisting of alumina and machinable glass.

17. The method according to claim 10 wherein said spacer member is initially slidable radially with respect to said side surfaces of said electrodes between which it is inserted.

18. The method according to claim 17 wherein said spacer member is urged radially inwardly toward the axis of said bores prior to raising the combination to said elevated temperature.

19. The method according to claim 10 wherein the step of providing said electrodes with high precision central bores comprises providing bores of the same diameter in said electrodes.

20. The method according to claim 10 wherein the step of providing said electrodes with high precision central bores comprising providing bores of progressively changing size with said rod being stepped in exterior diameter to match.

21. A method of forming a precision electrostatic lens structure capable of accurately focusing a charged particle beam, said method comprising the steps of:
   forming plural metal electrodes with side surfaces adapted for juxtaposition with respect to one another,
   providing said electrodes with precision bores extending therethrough,
   positioning a precision aligning rod through said bores in at least a pair of adjacent electrodes so as to be closely received by said bores for aligning the same,
   inserting an array of dielectric spacer members of predetermined thickness around the axis of said bores between said pair of adjacent electrodes,
   inserting brazing material between said adjacent electrodes and said spacer members,
   urging said adjacent electrodes and said spacer members together.
   raising the combination of said adjacent electrodes, said spacer members and said brazing material to an elevated temperature to secure said adjacent electrodes to said spacer members, and
   removing said rod from said bores which closely received the same.

22. The method according to claim 21 wherein said dielectric spacer members are urged radially inwardly prior to raising the combination to said elevated temperature.

23. The method according to claim 22 wherein said dielectric spacer members are urged inwardly with tensioned circumferential means disposed around said spacer members.

24. A precision electrostatic lens structure for accurately focusing a charged particle beam, said structure comprising:

plural metal electrodes with juxtaposed side surfaces and aligned central bores adapted to pass a charged particle beam, wherein electrodes of at least a pair of said electrodes are joined together by means of plural segmented dielectric spacer members circumferentially spaced from one another about the axis of said bores and brazed to side surfaces of said electrodes, said metal electrodes and said spacer members having substantially matching thermal coefficients of expansion.

25. The structure according to claim 24 wherein said side surfaces are parallel where they are joined together by said spacer members, said spacer members having matching parallel faces, said side surfaces and said matching faces being substantially perpendicular to the axis of said aligned central bores.

26. The structure according to claim 24 wherein an electrode of said pair of electrodes is provided with an axial portion which said segmented dielectric spacer members are positioned against.

27. The structure according to claim 26 wherein another electrode of said pair of electrodes has a larger diameter cylindrical portion at least partially overlaying said axial portion.

28. The structure according to claim 24 including three electrodes.

29. The structure according to claim 28 wherein the coefficients of thermal expansion of said electrodes and said spacer members are substantially matched.

30. The structure according to claim 24 wherein said structure is monolithic being supportable solely at one end thereof.

31. A precision electrostatic lens structure for accurately focusing a charged particle beam, said structure comprising:

plural metal electrodes with juxtaposed side surfaces and aligned central bores adapted to pass a charged particle beam, wherein electrodes of at least a pair of said electrodes are joined together with segmented dielectric spacer members, said side surfaces being parallel where they are joined together by said spacer members, said spacer members having matching parallel faces, said side surfaces and said matching faces being substantially perpendicular to the axis of said aligned central bores.

32. The structure according to claim 31 wherein said electrodes and said spacer members are brazed together.

33. The structure according to claim 31 including three electrodes.

34. The structure according to claim 31 wherein an electrode of said pair of electrodes is provided with an axial portion against which a said spacer member is positioned, and another electrode of said pair has a larger diameter cylindrical portion at least partially overlaying said axial portion.

* * * * *

UNITED STATES PATENT AND TRADEMARK OFFICE
CERTIFICATE OF CORRECTION

PATENT NO. : 5,241,182

DATED : August 31, 1993

INVENTOR(S) : Noel A. Martin; Robert L. Gerlach

It is certified that error appears in the above-identified patent and that said Letters Patent is hereby corrected as shown below:

Column 6, line 38, "therethrough" should be --alignment--.

Column 6, line 39, insert (new paragraph) --providing said electrodes with bores extending therethrough,--.

Column 6, line 49, "electrode" should be --electrodes--.

Column 7, line 21, "plurality" should be --plural--.

Column 7, line 30, after "one another" insert --and--.

Column 8, line 29, "comprising" should be --comprises--.

Signed and Sealed this

Twelfth Day of April, 1994

Attest:

BRUCE LEHMAN

Attesting Officer     Commissioner of Patents and Trademarks